(12) United States Patent
Park et al.

(10) Patent No.: US 6,849,465 B2
(45) Date of Patent: Feb. 1, 2005

(54) METHOD OF PATTERNING A MAGNETIC MEMORY CELL BOTTOM ELECTRODE BEFORE MAGNETIC STACK DEPOSITION

(75) Inventors: Chanro Park, Fishkill, NY (US); Gill Yong Lee, Wappingers Falls, NY (US)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/600,920

(22) Filed: Jun. 20, 2003

(65) Prior Publication Data

US 2004/0259274 A1 Dec. 23, 2004

(51) Int. Cl.[7] .............................................. H01L 21/00
(52) U.S. Cl. ........................ 438/3; 438/171; 438/210; 257/295; 365/145; 365/171
(58) Field of Search ............................ 438/3, 171, 210, 438/131; 257/295; 365/145, 149, 171–173, 33

(56) References Cited

U.S. PATENT DOCUMENTS

| | | | | |
|---|---|---|---|---|
| 5,365,096 A | * | 11/1994 | Taniguchi | 257/296 |
| 5,679,980 A | * | 10/1997 | Summerfelt | 257/751 |
| 5,708,284 A | * | 1/1998 | Onishi | 257/295 |
| 5,940,319 A | * | 8/1999 | Durlam et al. | 365/171 |
| 6,097,051 A | * | 8/2000 | Torii et al. | 257/306 |
| 6,153,443 A | * | 11/2000 | Durlam et al. | 438/3 |
| 6,518,588 B1 | * | 2/2003 | Parkin et al. | 257/3 |
| 6,583,507 B1 | * | 6/2003 | Moon et al. | 257/751 |
| 6,703,676 B2 | * | 3/2004 | Hirai et al. | 257/421 |
| 2002/0096775 A1 | * | 7/2002 | Ning | 257/763 |
| 2003/0216018 A1 | * | 11/2003 | Yamada et al. | 438/585 |
| 2004/0026369 A1 | * | 2/2004 | Ying et al. | 216/63 |
| 2004/0043579 A1 | * | 3/2004 | Nuetzel et al. | 438/401 |

* cited by examiner

Primary Examiner—Caridad Everhart
Assistant Examiner—Renzo N. Rocchegiani
(74) Attorney, Agent, or Firm—Slater & Matsil, L.L.P.

(57) ABSTRACT

A method of patterning a bottom electrode for a magnetic memory cell. The bottom electrode is patterned prior to the deposition of the soft layer of the magnetic tunnel junction (MTJ) material stack, preventing the formation of fencing on the sidewalls of the soft layer, which can cause shorts to subsequently formed conductive lines of the magnetic memory device. A sacrificial mask is used to pattern the bottom electrode material, and at least a portion of the sacrificial mask is consumed or removed during the patterning of the bottom electrode material. The soft layer is then deposited and patterned using a hard mask.

23 Claims, 5 Drawing Sheets

METHOD OF PATTERNING A MAGNETIC MEMORY CELL BOTTOM ELECTRODE BEFORE MAGNETIC STACK DEPOSITION

TECHNICAL FIELD

The present invention relates generally to the fabrication of semiconductor devices, and more particularly to the fabrication of magnetic random access memory (MRAM) devices.

BACKGROUND

Semiconductors are used in integrated circuits for electronic applications, including radios, televisions, cell phones, and personal computing devices, as examples. One type of semiconductor device is a semiconductor storage device, such as a dynamic random access memory (DRAM) and flash memory, which use a charge to store information.

A more recent development in memory devices involves spin electronics, which combines semiconductor technology and magnetics. The spin of an electron, rather than the charge, is used to indicate the presence of a "1" or "0". One such spin electronic device is a magnetic random-access memory (MRAM), which includes conductive lines positioned in a different direction, e.g., perpendicular to one another in different metal layers, the conductive lines sandwiching a magnetic stack. The place where the conductive lines intersect is called a cross-point. A current flowing through one of the conductive lines generates a magnetic field around the conductive line and orients the magnetic polarity into a certain direction along the wire or conductive line. A current flowing through the other conductive line induces the magnetic field and can partially turn the magnetic polarity, also. Digital information, represented as a "0" or "1", is storable in the alignment of magnetic moments. The resistance of the magnetic memory cell depends on the moment's alignment. The stored state is read from the magnetic memory cell by detecting the component's resistive state. A memory cell array may be constructed by placing the conductive lines and cross-points in a matrix structure having rows and columns. Magnetic stacks or cells in the cross-point array are usually selected by passing sub-threshold currents through the conductive lines, e.g., in both the x- and y-direction, and where the conductive lines cross, the combined magnetic field is large enough to flip the magnetic orientation.

An advantage of MRAMs compared to traditional semiconductor memory devices such as DRAMs is that MRAMs are non-volatile. For example, a personal computer (PC) utilizing MRAMs would not have a long "boot-up" time as with conventional PCs that utilize DRAMs. Also, an MRAM does not need to be powered up and has the capability of "remembering" the stored data.

SUMMARY OF THE INVENTION

Embodiments of the present invention provide a method of patterning a bottom electrode for a magnetic memory cell. The bottom electrode material layers are patterned first, and then the soft layer of the magnetic stack is deposited and patterned. Electrical shorts are preventing by depositing the soft layer of the magnetic stack after the bottom electrode has been deposited and patterned.

In accordance with a preferred embodiment of the present invention, a method of forming a bottom electrode of a magnetic memory cell, includes before depositing a soft layer material, depositing a sacrificial mask over a bottom electrode material, patterning the sacrificial mask, and patterning the bottom electrode material. The sacrificial mask is almost completely consumed after the patterning of the bottom electrode material.

In accordance with another preferred embodiment of the present invention, a method of fabricating a magnetic memory device, includes providing a workpiece, depositing a first insulating layer over the workpiece, forming a plurality of first conductive lines within the first insulating layer, and disposing a bottom electrode material over the first conductive lines and the first insulating layer. A sacrificial mask is deposited over the bottom electrode material, the sacrificial mask is patterned, and the sacrificial mask is used to pattern the bottom electrode material and form at least one bottom electrode for a magnetic memory cell. At least a portion of the sacrificial mask is consumed during the patterning of the bottom electrode material. The bottom electrode is patterned prior to depositing a soft layer of the magnetic memory device.

An advantage of a preferred embodiment of the present invention includes providing a method of patterning a bottom electrode that does not result in the formation of fence structures that can result in shorts of underlying conductive layers to subsequently formed conductive layers. No additional lithography masks are required for the novel process.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a MRAM device. Embodiments of the present invention may also be applied, however, to other magnetic memory cell designs and magnetic semiconductor device applications.

FIGS. 1 through 7 show cross-sectional views of a prior art method of patterning a bottom electrode 120/122 of a magnetic memory cell 100, wherein the bottom electrode 120/122 of the MRAM cells is patterned after the deposition of the soft layer 124. In the prior art method shown, the bottom electrode layers 120 and 122 are deposited, and the soft layer 124 is deposited over the bottom electrode layers 120 and 122. Then, the soft layer 124 is patterned, followed by the patterning of the bottom electrode layers 120 and 122. This can result in shorts being formed between the bottom electrode 120/122 and subsequently formed metallization layers 136, to be described further herein.

Figure 1:
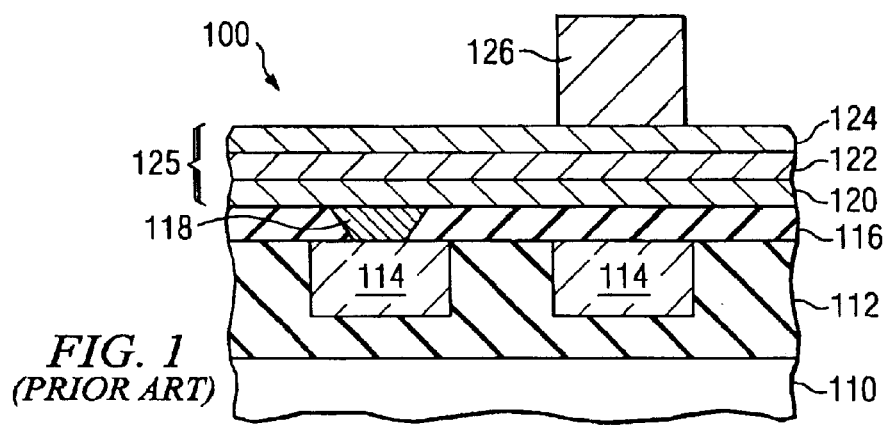
FIGS. 1 through 7 show cross-sectional views of a prior art method of patterning a bottom electrode of a magnetic memory cell at various stages, wherein the soft layer of the magnetic stack is deposited over the bottom electrode layers prior to patterning the bottom electrode layers.

Referring first to FIG. 1, a workpiece 110 is provided. The workpiece 10 may comprise one or more layers of a dielectric such as silicon oxide or low-k materials disposed over silicon single-crystal silicon, for example. The workpiece 110 may include other conductive layers or other semiconductor elements, such as transistors, or diodes, as examples.

A first insulating layer 112 is deposited or formed over the workpiece 110. The first insulating layer 112 may comprise an inter-level dielectric, and may comprise silicon dioxide, for example. Preferably, using a damascene process, the first insulating layer 112 is patterned for first conductive lines, and a conductive material is deposited over the wafer to fill the patterned first insulating layer 112 and first conductive lines 114. Excess conductive material is then removed from the top surface of the first insulating layer 112, using a chemical-mechanical polish (CMP) process, for example.

If the first conductive lines 114 comprise copper, the first conductive lines 114 are typically formed in a damascene process. However, alternatively, the first conductive lines 114 may be formed by the deposition of a conductive material, patterning and etch of the conductive material, and the deposition of a first insulating layer 112 between the first conductive lines 114, (not shown).

A second insulating layer 116 is deposited over the first conductive lines 114 and the first insulating layer 112. The second insulating layer 116 may comprise the same material as the first insulating layer 112, for example. The second insulating layer 116 is patterned, and a conductive material is deposited over the second insulating layer 116 to form vias 118 in the second insulating layer 116 that make electrical contact to the first conductive lines 114. The via conductive material may comprise copper, tungsten or other metals, for example. Excess conductive material is removed from the top surface of the second insulating layer 116, e.g., using CMP.

Next, a first conductive material 120 is deposited over the second insulating layer 116. The first conductive material 120 typically comprises a layer of TaN deposited over the second insulating layer 116, and a layer of Ta deposited over the TaN. Then, a second conductive material 122 is deposited over the first conductive material 120. The second conductive material 122 comprises PtMn or IrMn. The first conductive material 120 functions as a seed layer for the second conductive material 122. The second conductive material 122 is an anti-ferromagnetic seed layer for the fixed layer of the soft layer 124 of the magnetic stack, to be described further herein.

A soft layer 124 is then formed over the second conductive material 122, as shown in FIG. 1. The soft layer 124 includes a first magnetic layer deposited over the second conductive material 122, a thin insulating layer deposited over the first magnetic layer, and a second magnetic layer deposited over the thin insulating layer. The first magnetic layer may comprise a layer of CoFe, a layer of Ru deposited over the CoFe, a layer of CoFe deposited over the Ru, and optional additional magnetic layers, for example.

The first magnetic layer is often referred to as a fixed layer because its magnetic polarization direction is fixed during device operation by the underlying second conductive material layer 122 (the PtMn layer), which increases the coercive field of the fixed layer. The seed layer 122 is an anti-ferromagnetic layer that pins the magnetization of the fixed layer. The thin insulating layer of the soft layer 124 is referred to as the tunnel barrier or tunnel junction barrier. The second magnetic layer of the soft layer 124 may comprise a layer of CoFe, or NiFe, and optional additional magnetic layers, for example. The second magnetic layer is referred to as a free layer because the magnetic polarization direction may rotate depending on the magnetic field, which is how information is written to or stored in the MRAM device. The soft layer 124, the underlying pinning layer 122, and the seed layer 120 are often collectively referred to as a magnetic tunnel junction (MTJ) material stack or MTJ stack 125.

Figure 2:
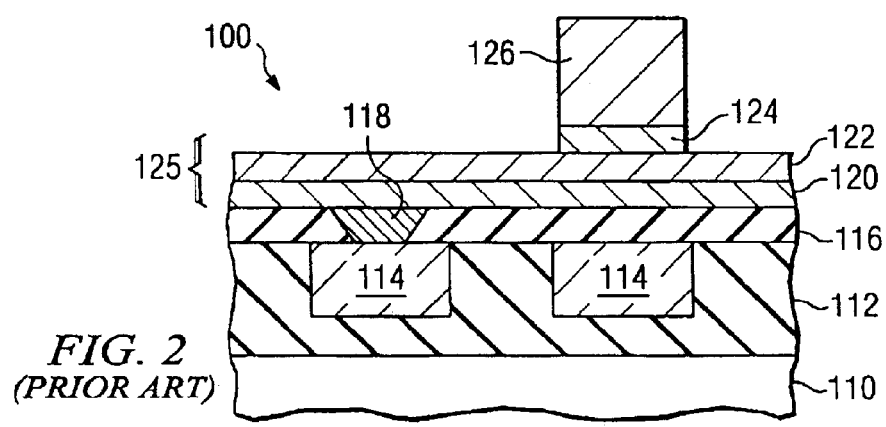

A hard mask 126 is deposited over the soft layer 124. The hard mask 126 may comprise a metal such as Ti, TiN, Ta, and TaN, as examples, although alternatively the hard mask 126 may comprise other materials. The hard mask 126 is opened or patterned, using a photoresist, as an example. The hard mask 126 is used to pattern the underlying soft layer 124, using a reactive ion etch (RIE) process, as shown in FIG. 2.

Figure 3:
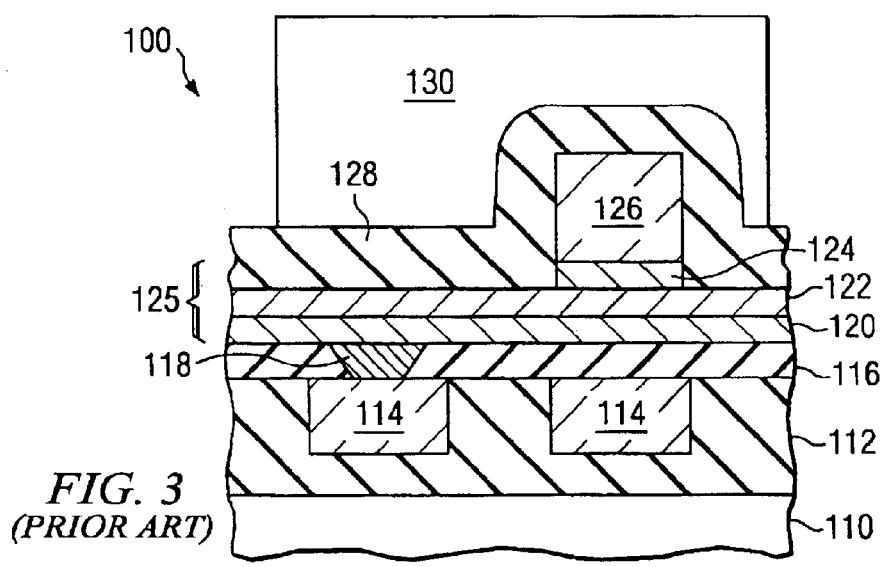

A dielectric hard mask 128 is deposited over the top surface of the wafer, over the patterned soft layer 124 and hard mask 126, as shown in FIG. 3. The dielectric hard mask 128 may comprise an oxide such as $SiO_2$, a nitride such as SiN, and/or combinations of these materials, as examples. The dielectric hard mask 128 is conformal, as shown. A photoresist 130 is deposited over the dielectric hard mask 128, and the photoresist 130 is patterned with the pattern for the bottom electrode of the magnetic memory device, as shown in FIG. 3.

Figure 4:
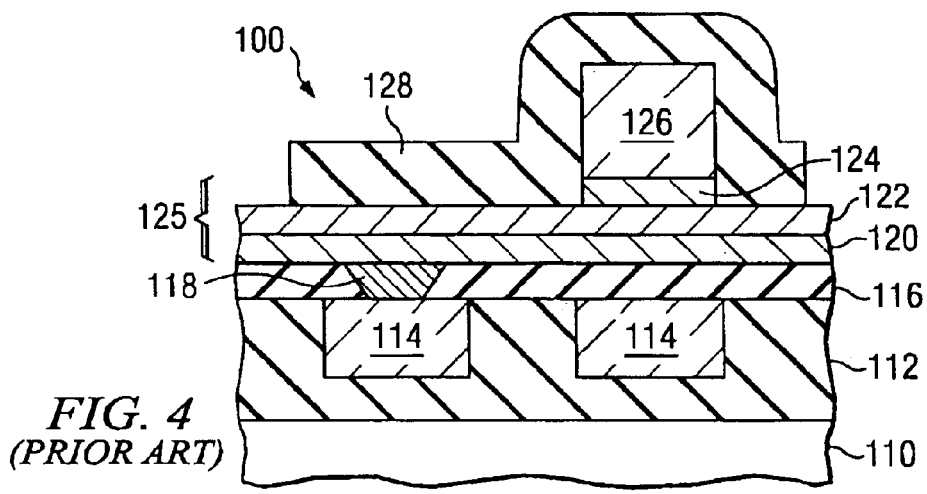
Figure 5:
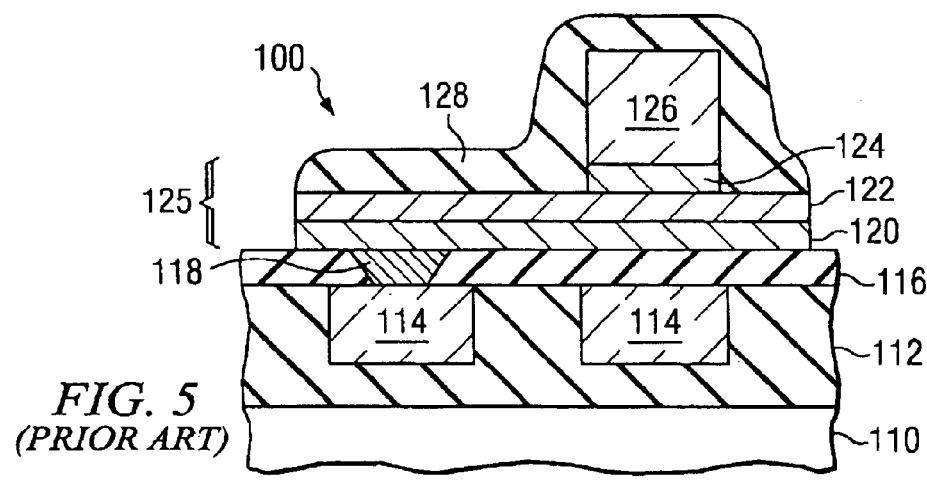

The photoresist 130 is used to pattern the dielectric hard mask 128, and the photoresist 130 is removed, leaving the structure shown in FIG. 4. The dielectric hard mask 128 is then used to pattern the underlying bottom electrode layers, in particular, the second conductive material 122 and the first conductive material 120, as shown in FIG. 5. The pinning layer 122 and seed layer 120 provide electrical contact of the fixed layer of the soft layer 124 to the via 118, which is electrically coupled to the underlying first conductive line 114.

Figure 6:
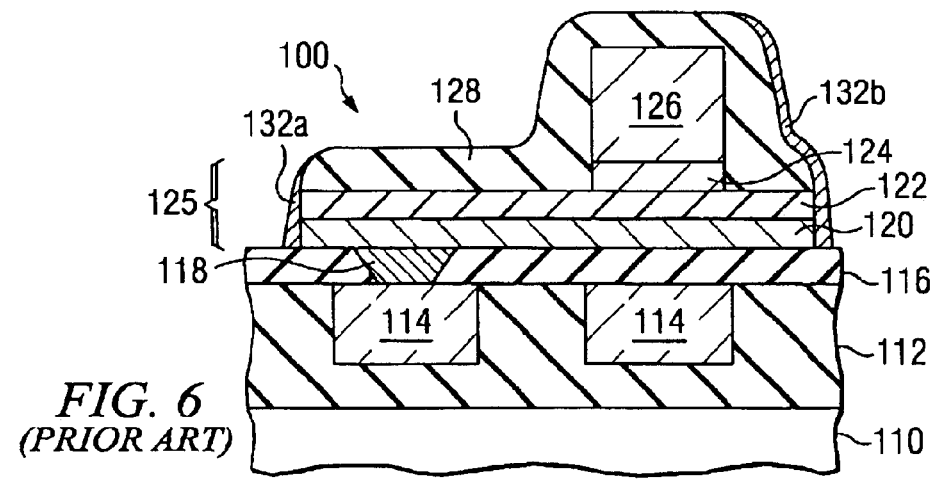

A problem with the process shown in FIGS. 1 through 5 is that during the patterning of the bottom electrode layers 120 and 122, an etch by-product 132a or 132b may be deposited on the sidewall of the materials 120 and 122 being patterned, and on the sidewalls of the dielectric hard mask 128, as shown in FIG. 6. For example, if the second conductive material 122 comprises PtMn, PtMn is a noble metal that is etched by physical sputtering. A sputter-etched PtMn layer can easily be re-deposited on the sidewall, in particular when the sidewall is high and vertical.

Figure 7:
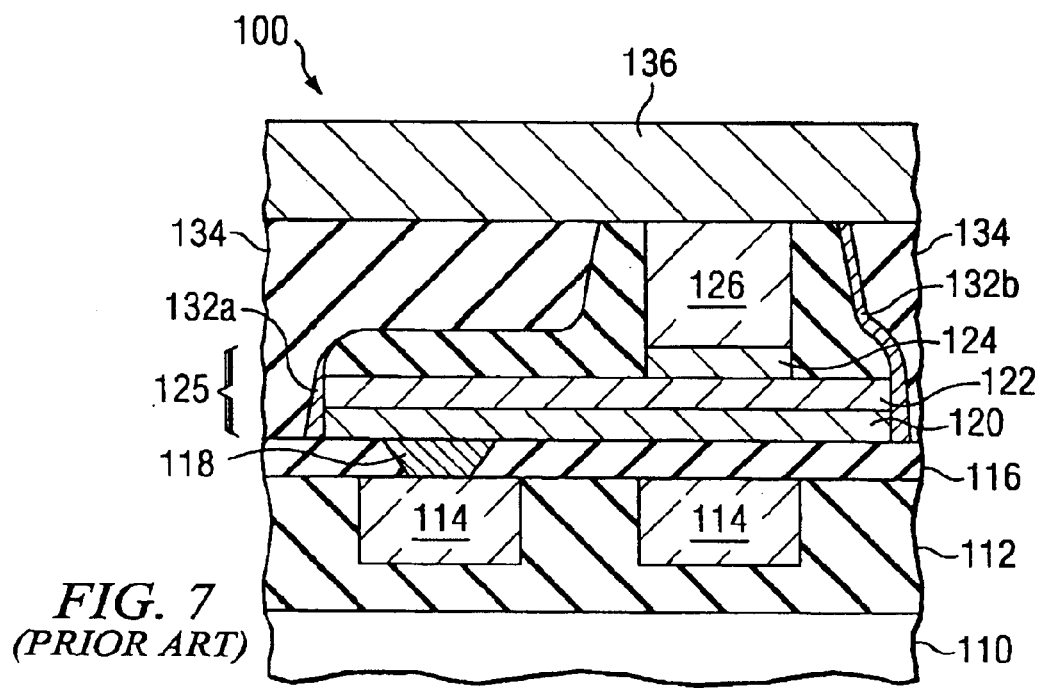

A conductive fence structure is problematic when it is formed over the dielectric hard mask 128 sidewall, as shown at 132b. The fence structure 132b creates a short between subsequently formed conductive lines 136, as shown in FIG. 7, after the deposition of a third insulating layer 134, and the formation of second conductive lines 136 to make contact to a top electrode of the magnetic memory cell formed by the patterned MTJ stack 125.

Embodiments of the present invention solve these problems in the prior art by patterning the bottom electrode prior to depositing or patterning of the soft layer of the MTJ stack. In accordance with embodiments of the present invention, the bottom electrode is defined after the bottom antiferromagnetic layer (PtMn) deposition, prior to the deposition of the soft layer of the MTJ stack.

Figure 8:
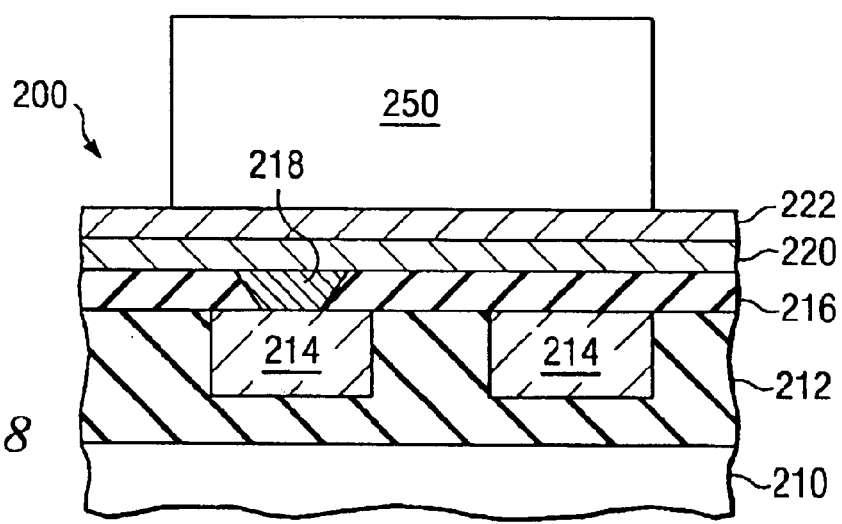
FIGS. 8 through 14 illustrate cross-sectional views of a magnetic memory cell at various stages of fabrication in accordance with an embodiment of the present invention, wherein the bottom electrode is patterned prior to the deposition of the soft layer of the magnetic stack.

FIGS. 8 through 14 illustrate cross-sectional views of a magnetic memory cell 200 in various stages of fabrication in accordance with an embodiment of the present invention. Referring now to FIG. 8, a workpiece 210 is provided. The workpiece 210 may comprise one or more layers of a dielectric such as silicon oxide or low-k materials disposed over silicon single-crystal silicon, for example. The workpiece 210 may include other conductive layers or other semiconductor elements, such as transistors, or diodes, as examples.

A first insulating layer 212 is deposited or formed over the substrate 210. The first insulating layer 212 may comprise an inter-level dielectric, and may comprise silicon dioxide, for example. In a damascene process, the first insulating layer 212 is patterned for first conductive lines, and a conductive material is deposited over the wafer to fill the patterned first insulating layer 212 and formed first conductive lines 214. Excess conductive material is removed from the top surface of the first insulating layer 212. If the first conductive lines 214 comprise copper, the first conductive lines 214 are preferably formed in a damascene process. However, alternatively, the first conductive lines 214 may be formed by the deposition of a conductive material, a patterning and etch of the conductive material, and then the deposition of a first insulating layer 212 between the first conductive lines 214, (not shown).

A second insulating layer 216 is deposited over the first conductive lines 214 and the first insulating layer 212. The second insulating layer 216 may comprise silicon dioxide and may alternatively comprise other dielectric materials, for example. The second insulating layer 216 is patterned, and a conductive material is deposited over the second insulating layer 216 to form vias 218 in the second insulating layer 216 that make electrical contact to the first conductive lines 214. Excess conductive material is removed from the top surface of the second insulating layer 216, using CMP, for example.

Next, a first conductive material 220 is deposited over the second insulating layer 216. The first conductive material 220 may comprise tantalum, tantalum nitride, or a bi-layer of both, as examples. The first conductive material 220 functions as a seed layer for the second conductive material 222 deposition. The first conductive material preferably comprises a 50 Angstrom thick layer of TaN deposited over the second insulating layer 216, and a 50 Angstrom thick layer of Ta deposited over the TaN layer. The TaN layer and Ta layer preferably range between 50 to 100 Angstroms in thickness, as examples.

A second conductive material 222 is deposited over the first conductive material 220. The second conductive material 222 preferably comprises PtMn, and may alternatively comprise IrMn, as examples, although, the second conductive material 222 may comprise other conductive materials. The PtMn is preferably 175 Angstroms thick, and may alternatively range from 125 to 300 Angstroms thick, for examples. The second conductive material 222 functions as the seed layer for the fixed layer of the soft layer 224 that will later be deposited (not shown in FIG. 8; see FIG. 11). The second conductive material 222 and the first conductive material 220 function as the bottom electrode for the memory cell because they electrically connect the via 218 (which is coupled to first conductive line 214) to the bottom fixed layer of the soft layer 224 that will later be formed (not shown in FIG. 8; see FIGS. 11–14).

Next, in accordance with an embodiment of the present invention, a sacrificial mask 250 is deposited over the second conductive material 222, as shown in FIG. 8. The sacrificial mask 250 preferably comprises photoresist or an oxide, and may alternatively comprise other materials such as a low dielectric constant material such as SiLK™ or Coral, as examples. The sacrificial mask 250 may comprise a thickness of approximately 1000 Angstroms to 5000 Angstroms, for example.

Figure 9:
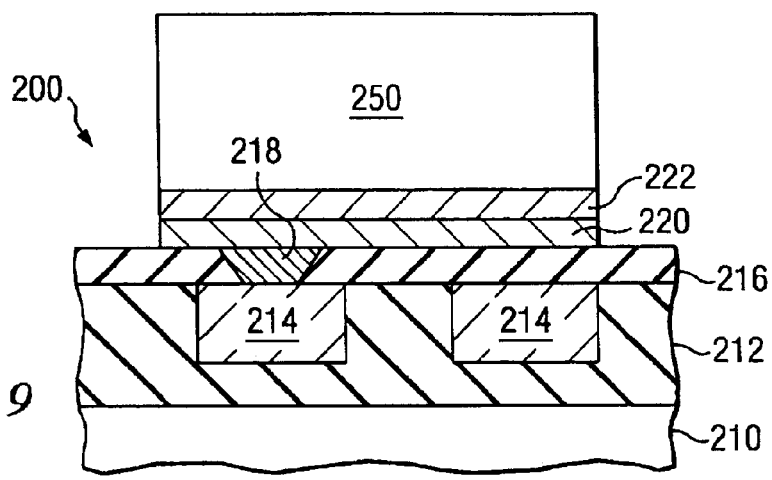

The sacrificial mask 250 is patterned, using a photoresist, for example, and the pattern of the sacrificial mask 250 is then transferred to the second conductive material 222 and first conductive material 220, as shown in FIG. 9. For example, the sacrificial mask 250 may be used as a mask while the underlying second conductive material 222 and first conductive material 220 are etched in a RIE process. The sacrificial mask 250 is sacrificial and will be completely or at least partially consumed during the patterning of the first and second conductive materials 220 and 222.

A different etchant chemistry may be required to etch the second and first conductive materials 222 and 220. For example, a chlorine based plasma may be used to etch the PtMn second conductive material 222, and a fluorine based plasma may be used to etch the Ta/TaN first conductive material 220. When two different etch chemistries are used, either one or both of the etch processes results in a removal of a portion of the sacrificial mask 250.

Figure 10:
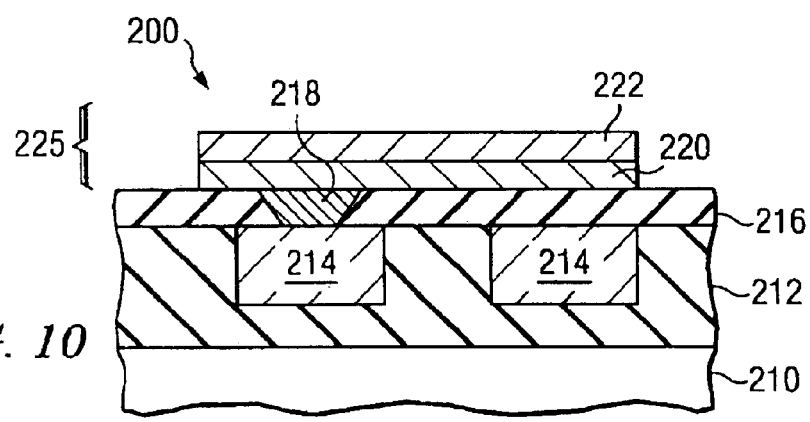

Any remaining portions of the sacrificial mask 250 are then removed, as shown in FIG. 10. If the sacrificial mask 250 comprises photoresist, then the sacrificial mask 250 may be removed by a dry strip, followed by a wet cleaning process, as an example. If the sacrificial mask 250 comprises an oxide, the oxide hard mask 250 may be removed by dilute or buffered hydrofluoric acid (DHF or BHF), as an example. If the sacrificial mask 250 comprises a low dielectric constant material, then the sacrificial mask 250 may be removed by a plasma etch process followed by a wet cleaning. The processes used to remove the sacrificial mask 250 described herein are merely exemplary; the sacrificial mask 250 removal selection is a function of the material used for the sacrificial mask 250.

In one embodiment of the present invention, the sacrificial mask 250 preferably comprises a thickness such that the entire sacrificial mask 250 thickness is almost entirely consumed or completely consumed by the end of the etch process to etch the second conductive material 222 and first conductive material 220. This is advantageous because the formation of a fence structure on the sidewalls of the first and second conductive materials 220 and 222 is prevented.

Preferably, to prevent damage to the second conductive material 222, the sacrificial mask 250 comprises a thickness such that the etch process of the first and second conductive materials 220 and 222 is stopped as soon as, or before, the sacrificial mask 250 is completely removed. However, if the sacrificial mask 250 is too thick, then this can result in fence formation along the sidewalls of the first and second conductive materials 220 and 222. Therefore, the sacrificial mask 250 preferably comprises an optimum thickness to achieve a balance between these two factors.

Figure 11:
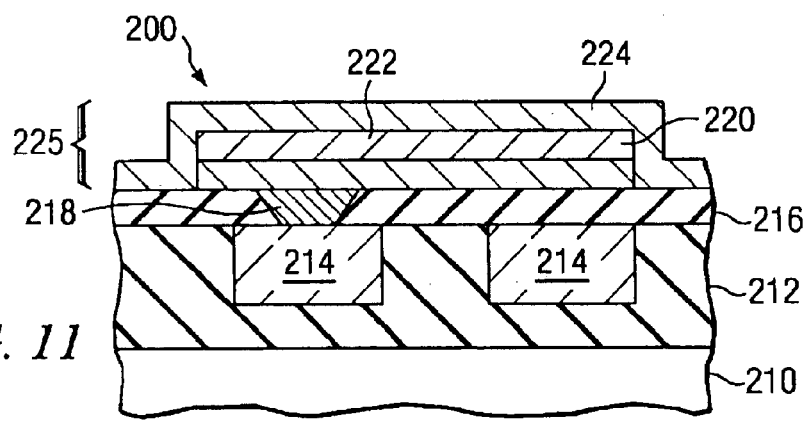

Next, the soft layer 224 material layers are deposited, as shown in FIG. 11. The soft layer 224 may comprise 1) a fixed layer comprising a layer of CoFe, a layer of Ru, a layer of CoFe, and optional additional magnetic layers; 2) a tunnel barrier comprising a layer of AlO; and 3) a free layer comprising a layer of CoFe, or a layer of NiFe, and one or more optional additional magnetic layers, as examples. The soft layer 224, second conductive material 222 and first conductive material 220 comprise a MTJ stack 225.

Figure 12:
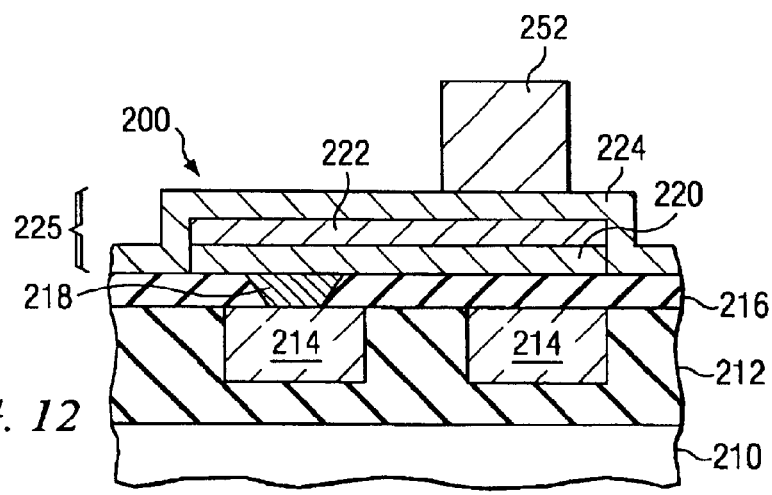
Figure 13:
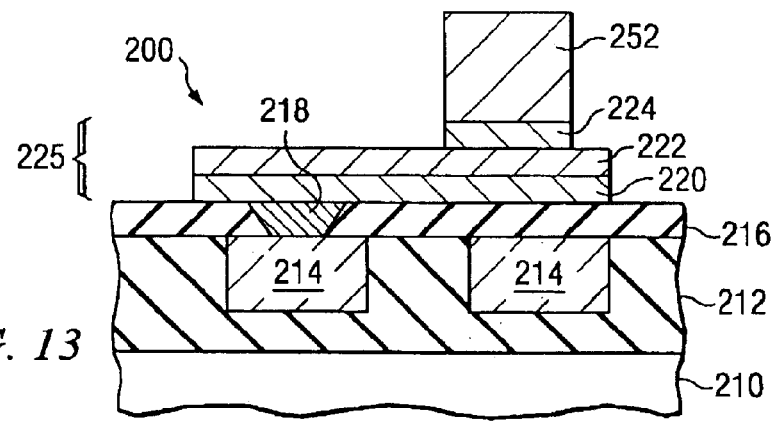
Figure 14:
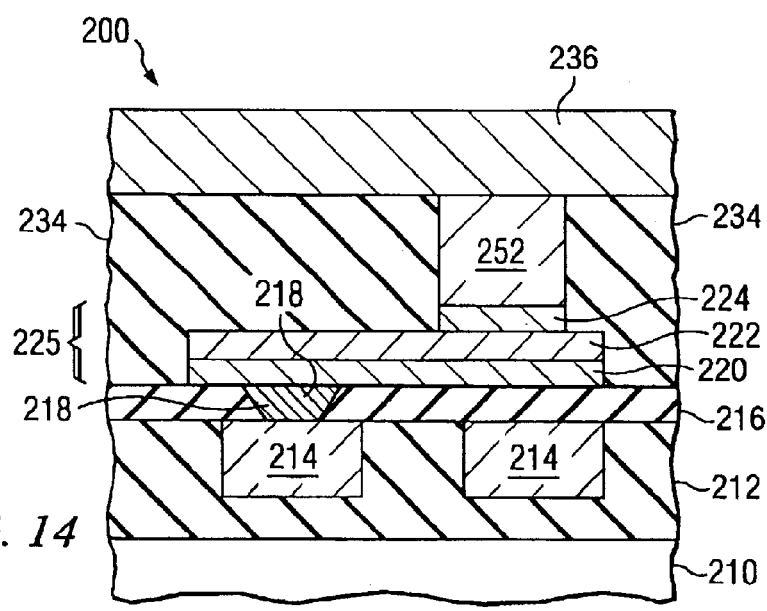

A hard mask 252 is deposited and patterned as shown in FIG. 12, and the hard mask 252 is used to pattern the soft layer 224, as shown in FIG. 13. The soft layer 224 of the MTJ stack 225 may be patterned by reactive ion etch (RIE) as an example. A third insulating layer 234 may be deposited, and second conductive lines 236 may then be formed within the third insulating layer 234, as shown in FIG. 14. Thus, in accordance with embodiments of the invention, a magnetic memory cell 200 is manufactured that is absent fence formation on sidewalls of the bottom electrode 220/222 and absent fences that create shorts between conductive lines 236 and 214.

Advantageously, embodiments of the present invention result in the minimization or elimination of fence formation on the sidewalls of vertical structures in magnetic memory cells, thus preventing the formation of shorts to subsequently deposited metallization layers, as shown in FIG. 14. Reduced fence formation also improves the downstream manufacturing process by not introducing additional topography to the patterned magnetic memory cells. Embodiments of the present invention may be implemented with existing mask sets, and do not require any additional masks.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that the materials and processes described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a bottom electrode of a magnetic memory cell, comprising:

before depositing a soft layer material, depositing a sacrificial mask over a bottom electrode material, said sacrificial mask having a thickness selected to avoid the formation of a conductive fence along the sidewalls of the bottom electrode material;

patterning the sacrificial mask;

patterning the bottom electrode material without forming said conductive fence and such that the sacrificial mask is almost completely consumed while patterning of the bottom electrode material.

2. The method according to claim 1, wherein the sacrificial mask comprises photoresist, an oxide, or a low dielectric constant material.

3. The method according to claim 1, wherein the sacrificial mask comprises a thickness of 1000 to 5000 Angstroms.

4. The method according to claim 1, wherein the bottom electrode material comprises a first conductive material and a second conductive material formed over the first conductive material.

5. The method according to claim 4, wherein the first conductive material comprises a layer of Ta and a layer of TaN.

6. The method according to claim 5, wherein the first conductive material comprises 50–100 Angstroms of Ta and 50–100 Angstroms of TaN.

7. The method according to claim 4, wherein the second conductive material comprises PtMn or IrMn.

8. The method according to claim 7, wherein the second conductive material comprises 125 to 300 Angstroms of PtMn or IrMn.

9. A method of fabricating a magnetic memory device, comprising:

providing a workpiece;

depositing a first insulating layer over the workpiece;

forming a plurality of first conductive lines within the first insulating layer;

disposing a bottom electrode material over the first conductive lines and the first insulating layer;

depositing a sacrificial mask over the bottom electrode material, said sacrificial mask having a thickness selected to avoid the formation of a conductive fence along the sidewalls of the bottom electrode material;

patterning the sacrificial mask; and using the sacrificial mask to pattern the bottom electrode material and form at least one bottom electrode for a magnetic memory cell without forming said conductive fence and such that at least a portion of the sacrificial mask is consumed during the patterning of the bottom electrode material, and wherein the bottom electrode is patterned prior to depositing a soft layer of the magnetic memory device.

10. The method according to claim 9, further comprising depositing a soft layer over the patterned bottom electrode, after patterning the bottom electrode material.

11. The method according to claim 10, further comprising depositing a hard mask over the soft layer.

12. The method according to claim 11, further comprising patterning the hard mask, and using the hard mask to pattern the soft layer, wherein the patterned soft layer comprises a magnetic memory cell.

13. The method according to claim 12, further comprising:

depositing a second insulating layer over the first conductive lines and first insulating layer;

patterning the second insulating layer with a via pattern;

filling the patterned second insulating layer with conductive material to form a via contacting at least one first conductive line, wherein the via makes electrical contact with a bottom portion of the magnetic memory cell;

depositing a third insulating layer over the patterned bottom electrode; and forming a plurality of second conductive lines in the third insulating layer, wherein at least one second conductive line makes electrical contact to an upper portion of the magnetic memory cell.

14. The method according to claim 9, wherein disposing the bottom electrode material comprises depositing a first conductive material over the first conductive lines and the first insulating layer, and depositing a second conductive material over the first conductive material.

15. The method according to claim 14, wherein depositing the first conductive material comprises depositing 50–100 Angstroms of Ta over the first conductive lines and the first insulating layer and depositing 50–100 Angstroms of TaN over the Ta.

16. The method according to claim 14, wherein depositing the second conductive material comprises depositing 125 to 300 Angstroms of PtMn or IrMn over the first conductive material.

17. The method according to claim 9, wherein the sacrificial mask comprises photoresist, an oxide, or a low dielectric constant material.

18. The method according to claim 9, wherein the sacrificial mask comprises a thickness of 1000 to 5000 Angstroms.

19. The method according to claim 9, wherein the sacrificial mask is almost completely consumed during the patterning of the bottom electrode material, further comprising removing remaining portions of the sacrificial mask after patterning the bottom electrode material.

20. The method according to claim 9, wherein after the patterning of the bottom electrode material, the sacrificial mask has been completely removed.

21. A method of fabricating a magnetic memory device comprising the steps of:

providing a workpiece comprising a plurality of first conductive lines within a first insulating layer;

forming a bottom electrode material over said first conductive lines and said first insulating layer, said bottom electrode material comprising a first conductive layer deposited over said first conductive lines and said first insulating layer and depositing a second conductive layer of material selected from the group consisting of PtMn and IrMn over the first conductive layer;

depositing a sacrificial mask over said bottom electrode;

patterning said sacrificial mask;

using said patterned sacrificial mask to pattern said bottom electrode material to form at least one bottom electrode for a magnetic memory cell and such that said sacrificial mask is substantially consumed;

depositing a soft layer of magnetic memory material over said patterned bottom electrode material;

forming a patterned hard mask of conductive material over said magnetic memory material;

using said patterned hard mask to pattern said soft layer of magnetic memory material so as to form a magnetic memory cell, said magnetic memory cell and said patterned hard mask having a selected thickness;

forming a third insulating layer over said workpiece, said third insulating layer having a thickness substantially equal to said selected thickness; and forming a plurality of second conductive lines over said third insulating layer such that at least one of said plurality of said second conductive lines makes electrical contact with said patterned hard mask of conductive material.

22. The method of claim 21 wherein said first conductive layer comprises a layer of Tan over a layer of Ta.

23. The method of claim 21 wherein said sacrificial mask has a thickness selected to avoid the formation of a conductive fence along the sidewalls of the bottom electrode.

* * * * *